(12) United States Patent
Koste

(10) Patent No.: US 7,508,213 B2
(45) Date of Patent: Mar. 24, 2009

(54) INTEGRATED OPTICAL LINK FOR MR SYSTEM

(75) Inventor: Glen P. Koste, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 95 days.

(21) Appl. No.: 11/553,254

(22) Filed: Oct. 26, 2006

(65) Prior Publication Data

US 2008/0146907 A1    Jun. 19, 2008

(51) Int. Cl.
G01V 3/00 (2006.01)
(52) U.S. Cl. .................. 324/322; 324/307; 324/318
(58) Field of Classification Search ............... 324/307, 324/318, 322
See application file for complete search history.

(56) References Cited

U.S. PATENT DOCUMENTS

| | | | |
|---|---|---|---|
| 5,739,936 A * | 4/1998 | Yakymyshyn et al. | 398/145 |
| 6,925,322 B2 * | 8/2005 | Helfer et al. | 600/423 |
| 6,980,848 B2 * | 12/2005 | Helfer et al. | 600/423 |
| 7,345,485 B2 * | 3/2008 | Jevtic et al. | 324/322 |
| 2005/0215894 A1 | 9/2005 | Dasgupta et al. | |
| 2006/0066311 A1 | 3/2006 | Koste et al. | |
| 2006/0066312 A1 | 3/2006 | Watkins et al. | |

OTHER PUBLICATIONS

"CMOS Photonics (TM) Platform," Nov. 2005, Luxtera, Inc., Carlsbad, CA.

* cited by examiner

*Primary Examiner*—Brij B. Shrivastav
*Assistant Examiner*—Megann E Vaughn
(74) *Attorney, Agent, or Firm*—Eileen W. Gallagher

(57) ABSTRACT

A system and method for optical data transmission between MR scanning equipment and a data processing unit includes a silicon-based optical modulator which receives MR signals from RF coils and encodes them onto an optical carrier for transmission over an optical link for image reconstruction. The silicon-based optical modulator may be integrated into an electrical connection of the MR scanning equipment. A faster data transfer with lower susceptibility to noise is thus achieved.

18 Claims, 5 Drawing Sheets

INTEGRATED OPTICAL LINK FOR MR SYSTEM

BACKGROUND OF THE INVENTION

The present invention relates generally to MR imaging systems, and, more particularly, to a system and method for fast and efficient data transfer of MR signal data between an MR scanner and a data processing or image reconstruction unit. The invention includes the use of optical modulation to encode data onto an optical carrier for transmission, such as over a fiber-optic cable or other optical link.

MR systems operate by detecting the free induction decay (FID) signals emitted by excited tissues. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The scanning equipment of the MR system, such as the transmit/receive RF coils and gradient coils, is often located in an MR scanner within a magnetically shielded room. The set of received NMR signals resulting from a scan sequence are digitized and sent to a data processing unit, often located outside the shielded room, for image reconstruction using one of many well known reconstruction techniques. It is desirable that the imaging process, from data acquisition to reconstruction, be performed as quickly as possible for improved patient comfort and throughput. Furthermore, data for reconstruction should contain as high a signal to noise ratio as possible to reduce the likelihood that additional scans will be needed.

One particular factor lending to the speed of an imaging process is the signal to noise ratio of the link between the MR scanning equipment and the data processing unit. A system which achieves a high signal to noise ratio (SNR) for accurate data receipt will have a faster and improved imaging process.

Most MR systems utilize electrical signals to convey data from the MR coils to the image reconstruction unit. These systems typically use coaxial cable, or other copper-wire based media, to transfer data. However, electrical signals traveling through such cables can experience undesirable amounts of noise and signal power loss. The connections of these cables are often bulky, to accommodate for impedance-modifying circuits, filters, amplifiers, and other electronics required for electrical communication. Furthermore, electrical data transmission over cables can suffer from data loss or noisy SNR from such phenomena as EMI and crosstalk. Conventionally, MR systems aim at having less than 1 dB of noise figure on signal transmission. And, while many accommodations have been made to mitigate the impact of these limitations, such as high performance amplifiers to improve SNR, the limitations are compounded by the introduction of large coil arrays.

Some recent MR systems have explored the use of optical data transfer. These systems rely upon lithium-niobate optical modulators to encode data onto light energy from high power, low noise laser sources. Generally, lithium-niobate is used as a controllable refractive crystal, to modulate laser light energy by interfering two light beams from the same laser source in which one beam or both beams are phase modulated. These modulators are also rather bulky (to accommodate the crystal), are expensive, and are not easily integrated or retrofitted into existing scanners. A related drawback is the difficulty associated with connecting and disconnecting lithium-niobate modulators. Since these modulators must individually be integrated into an MR coil housing, an optical connection for the carrier must be engaged and disengaged, as opposed to an electrical connection as in coax-based systems. In addition, MR systems using lithium-niobate modulators are less efficient, usually requiring high power laser carriers and upwards of 3 volts to modulate the phase of a signal by $\Pi$ radians.

It would therefore be desirable to have a system which achieves optical MR data transmission and maintains high SNR, while remaining compact, inexpensive, and benefiting from lower power carrier requirements. In addition, it would be beneficial if it was easily retrofitted and did not require direct optical disconnection and reconnection for each new patient for improved reliability and easier servicing.

BRIEF DESCRIPTION OF THE INVENTION

The present invention provides a system and method for optical data transmission from an MR scanner and associated RF coil assemblies to an image reconstruction or data processing unit. Optical modulators used in accordance with the present invention may be electrically connected to the RF coil assemblies. The modulators may also be integrated into the electrical connector housing itself (rather than into a coil assembly), such that optical connections in or to the MR scanner equipment are not required.

In accordance with another aspect of the invention, an MRI system includes a plurality of gradient coils positioned about a bore of a magnet to impress a polarizing magnetic field. An RF coil assembly is arranged to receive MR signals from a subject of interest. The MRI system also includes a silicon-based optical modulator which receives the signals from the RF coil assembly and modulates them onto an optical carrier for transmission over an optical link to a demodulation unit. A signal processing unit receives the demodulated signal from the demodulation unit and generates an MR image therefrom.

In accordance with another aspect of the invention, the invention includes a method for MR data transmission wherein MR data is acquired from a subject using one or more RF coils, then electrically communicated to an optical modulator integrated into an electrical connector of the coil. An optical carrier is then modulated within the electrical connector based upon the MR data, to be conveyed for subsequent image reconstruction.

In accordance with a further aspect of the invention, an MR data link is disclosed. The data link includes an electrical connector for outputting signals received by RF coils and an optical modulator integrated into the electrical connector. The modulator has an electrical data port to receive the signals from the RF coils, an optical input connection to receive an externally-generated optical beam, a silicon-based modulating circuit designed to modulate the externally-generated optical beam, and an optical output connection to transmit the modulated optical beam for image reconstruction.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
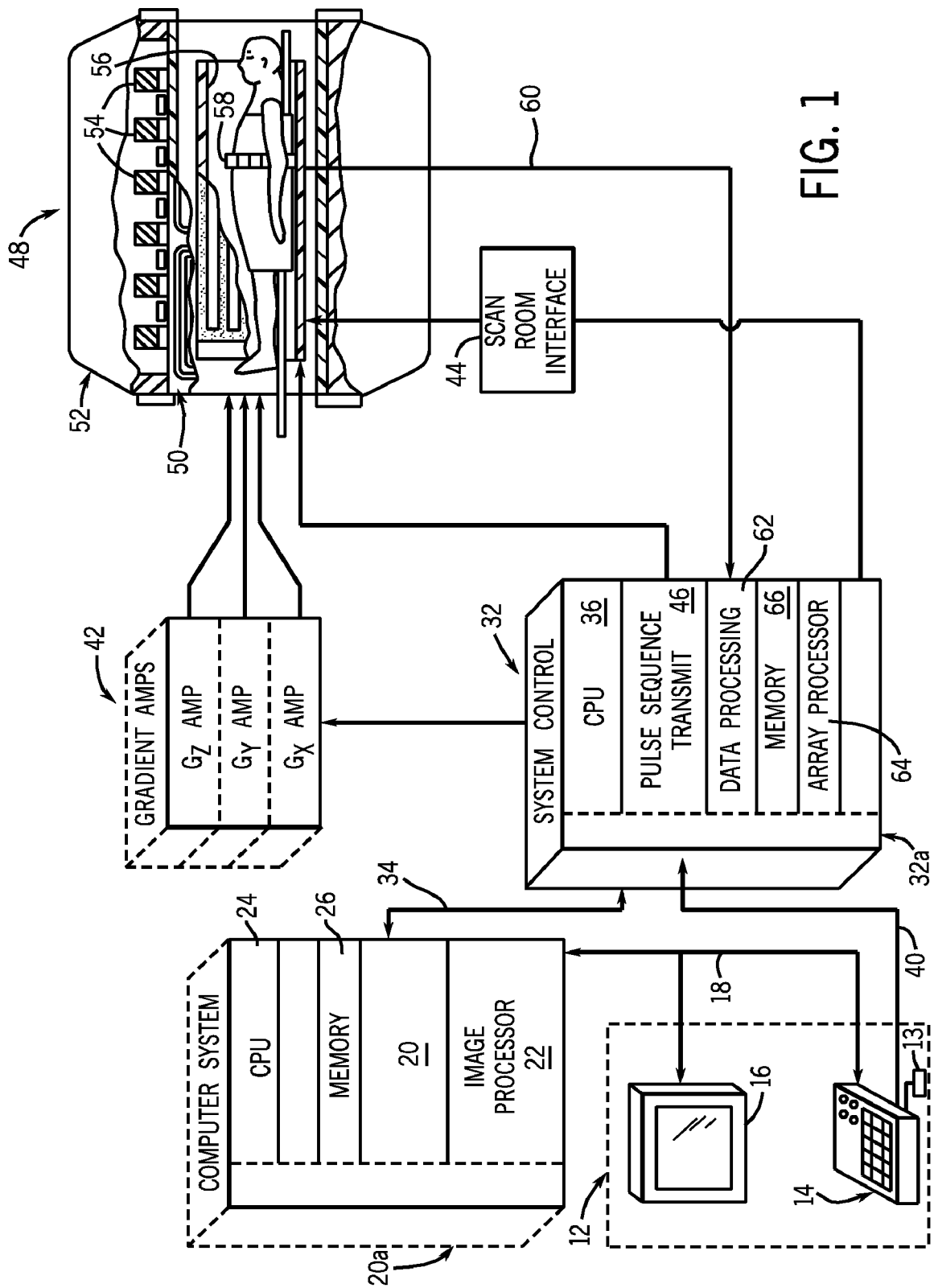
FIG. 1 is a schematic block diagram of an MR imaging system incorporating the present invention.

Referring to FIG. 1, the major components of an example magnetic resonance imaging (MRI) system incorporating the present invention are shown. The operation of the system may be controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 may also be connected to permanent or back-up memory storage, a network, or may communicate with a separate system control 32 through a high speed serial link 34. The input device 13 can include a mouse, keyboard, track ball, touch activated screen, light wand, or any similar or equivalent input device, and may be used for interactive geometry prescription.

The system control 32 includes a set of modules connected together by a backplane 32a and connected to the operator console 12 through a serial link 40. It is through link 40 that the system control 32 receives commands from the operator to indicate the scan sequence that is to be performed. The pulse sequence transmit module 46 commands the scanner components to carry out the desired scan sequence, by sending instructions, commands, and/or requests describing the timing, strength and shape of the RF pulses and pulse sequences to be produced, to correspond to the timing and length of the data acquisition window. The system control 32 also connects to a set of gradient amplifiers 42, to indicate the timing and shape of the gradient pulses that are produced during the scan. The system control 32 may also receive patient data from a scan room interface 44, which may relate data from a user or from a number of different sensors connected to the patient, such as ECG signals from electrodes attached to the patient.

The gradient waveform instructions produced by system control 32 are sent to the gradient amplifier system 42 having Gx, Gy, and Gz amplifiers. Amplifiers 42 may be external of scanner 48, or may be integrated therein. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and an RF coil assembly 56, 58. RF coil assembly may include a whole-body RF transmit coil 56, surface or parallel imaging coils 58, or both. The coils 56, 58 of the RF coil assembly may be configured for both transmitting and receiving, or for transmit-only or receive-only. A pulse generator (not shown) integrated into the scanner equipment 48 produces RF pulses in accordance with the instructions of the pulse sequence transmit module 46 which are amplified and coupled to the RF coil 56 for transmission. Alternatively, RF transmit coil 56 may be replaced or augmented with surface and/or parallel transmit coils, such as coil 58. Similarly, the resulting signals emitted by the excited nuclei in the patient may be sensed by separate receive coils, such as parallel coils or surface coils 58, and are then sent over a data link 60. The MR signals are demodulated, filtered, and digitized in the data processing section 62 of the system control 32.

A scan is complete when an array of raw k-space data has been acquired in the memory module 66. This raw k-space data is rearranged into separate k-space data arrays for each image to be reconstructed, and each of these is input to an array processor 64 which operates to Fourier transform the data into an array of image data. This image data is conveyed through the serial link 34 to the computer system 20 where it is stored in memory 26. In response to commands received from the operator console 12, this image data may be archived in long term storage or may be further processed by the image processor 22 and conveyed to the operator console 12 and presented on the display 16.

Figure 2:
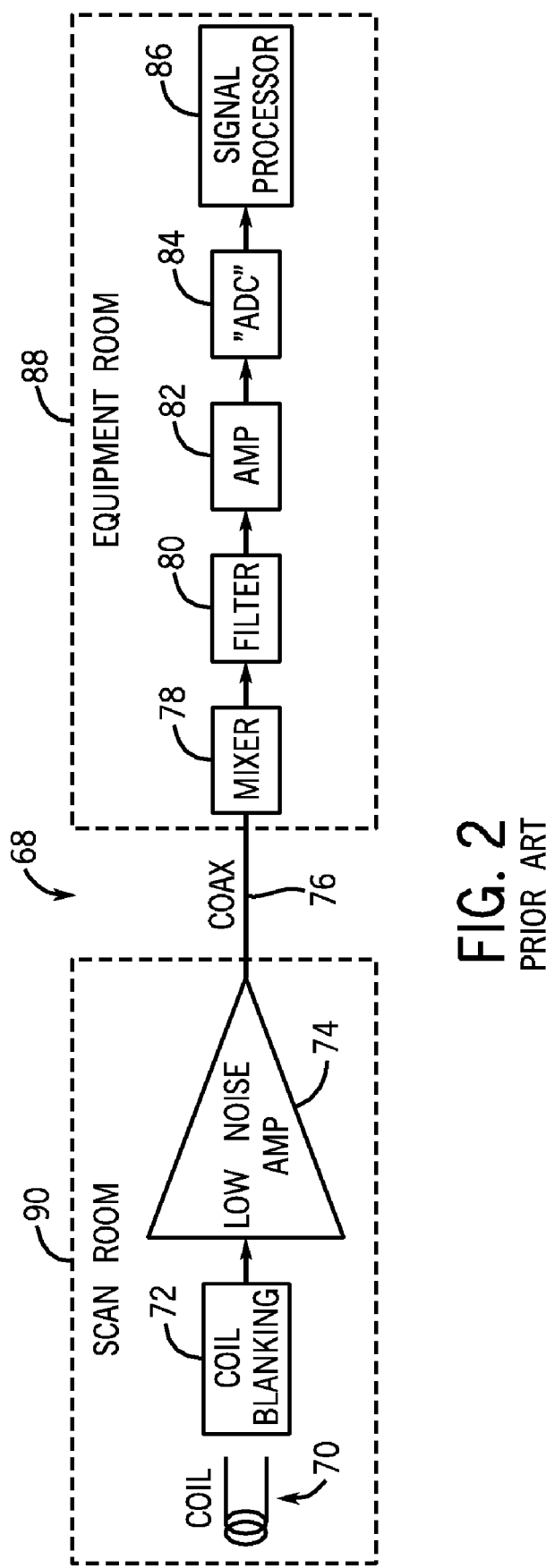
FIG. 2 is a block diagram of an MR system using electrical data transmission.

FIG. 2 is a block diagram of an MR system and associated electrical communication link 68, typically used in prior MR systems. Communication link 68 operates to perform a similar function to that of data link 60 of FIG. 1. RF coil 70 is a receive coil which detects MR signals emitted from excited tissues. Coil blanking circuit 72 operates to permit data transmission from coil 70 only during the acquisition portion of an MR process, not during excitation or RF pulse transmission. A low-noise amplifier 74 is connected to the output of coil blanking circuit 72 to improve signal quality for transmission. Generally, MR systems operate best when the noise figure of a transmitted data stream is 1 dB or less. Once conditioned, MR data is transmitted from the MR scanning equipment 70, 72 (located in a shielded room 90) across coax cable 76 to an equipment or processing station 88 (which may be within or without shielded room 90). A mixer 78, filter 80, and signal amplifier 82 demodulate and condition the data signal received in processing room 88. Analog-to-digital converter 84 processes the data signal so that it can be read by the digital signal processor 86 for k-space sampling and image reconstruction.

Figure 3:
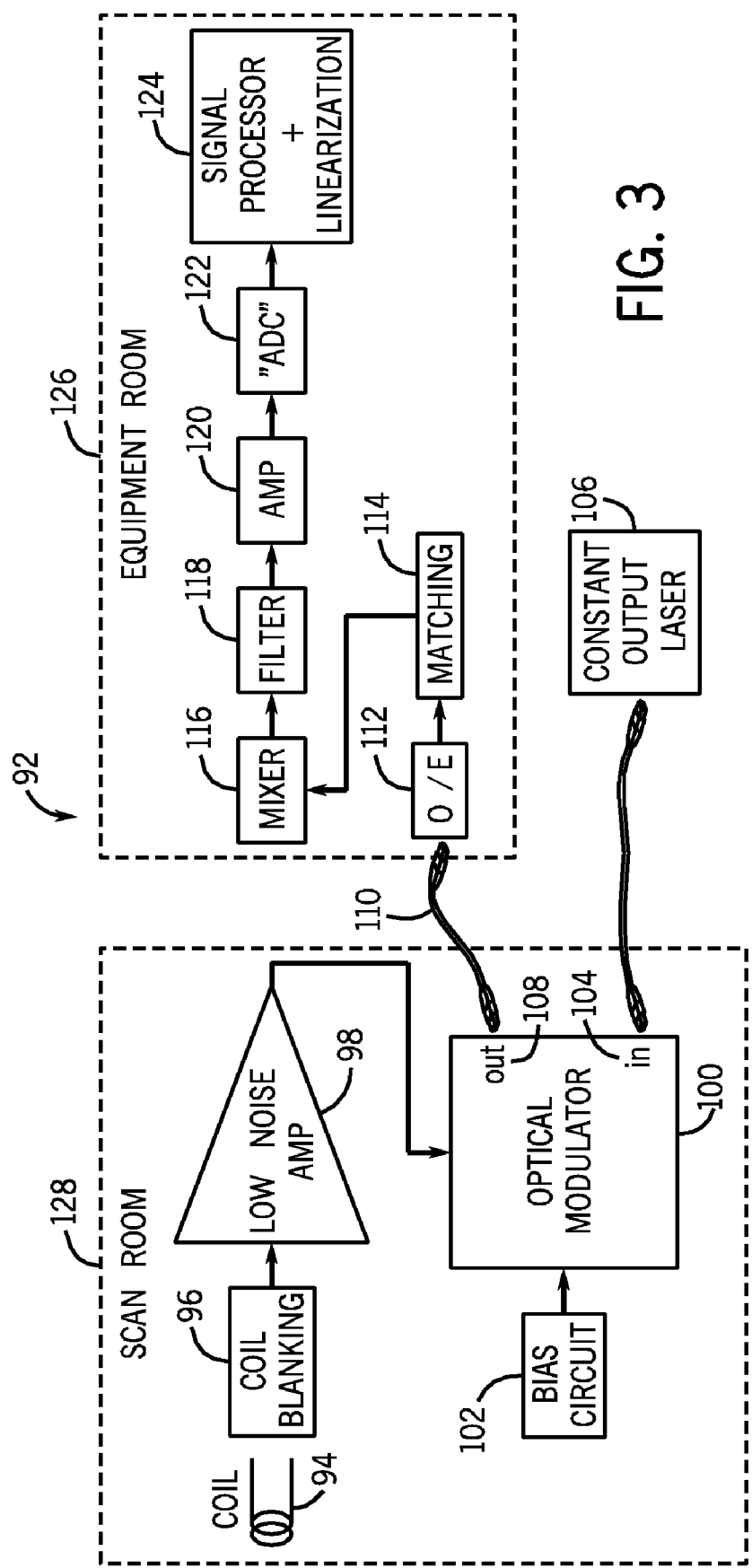
FIG. 3 is a block diagram of an MR system using optical data transmission in accordance with the present invention.

FIG. 3 shows the incorporation of optical data transmission into an MR system 92 (such as shown in FIG. 1), in accordance with the present invention. Shielded room 128 contains MR scanning equipment, including an RF receive coil 94 connected to a coil-blanking circuit 96. A low noise amplifier 98 may also be included, though some embodiments may not require an amplifier 98. Instead, an impedance-matching circuit (not shown), or other more-simplified mechanism for data amplification and conditioning may be substituted when higher amplification or filtering is not needed or desired.

Optical modulator 100 receives the output of low noise amplifier 98, and modulates laser light energy or an optical carrier to encode the MR data received by coil 94 thereon. Constant output laser 106 generates the optical carrier and transmits to modulator 100 via a fiber optic cable. Preferably, optical modulator 100 is a CMOS optical modulator, or other silicon-based optical modulator. In this regard, modulator 100 is controlled by a bias circuit 102 which applies a biasing voltage to maintain modulator 100 in a forward bias mode. As the optical carrier passes through the CMOS modulator 100, it is split, phase shifted, and recombined to produce a modulated output. A preferred CMOS optical modulator known as the CMOS Photonics™ Platform is available from Luxtera, Inc., 1819 Aston Ave., Suite 102, Carlsbad, Calif. 92008.

The modulated carrier is transmitted across an optical fiber 110 to an equipment room or station 126 for processing and image reconstruction. Equipment room 126 contains an optical-to-electric converter 112 which produces an electrical output equivalent to the modulated optical carrier. This electric signal is then filtered and conditioned by impedance matching circuit 114, mixer 116, filter 118, and amplifier 120. An analog-to-digital converter 122 digitizes the signal for processing and image reconstruction by signal processing unit 124. By utilizing the optical data transmission of FIG. 3, MR systems can achieve lower noise data transfer, with less susceptibility to EMI, and requiring lower power for longer transmission.

Figure 4:
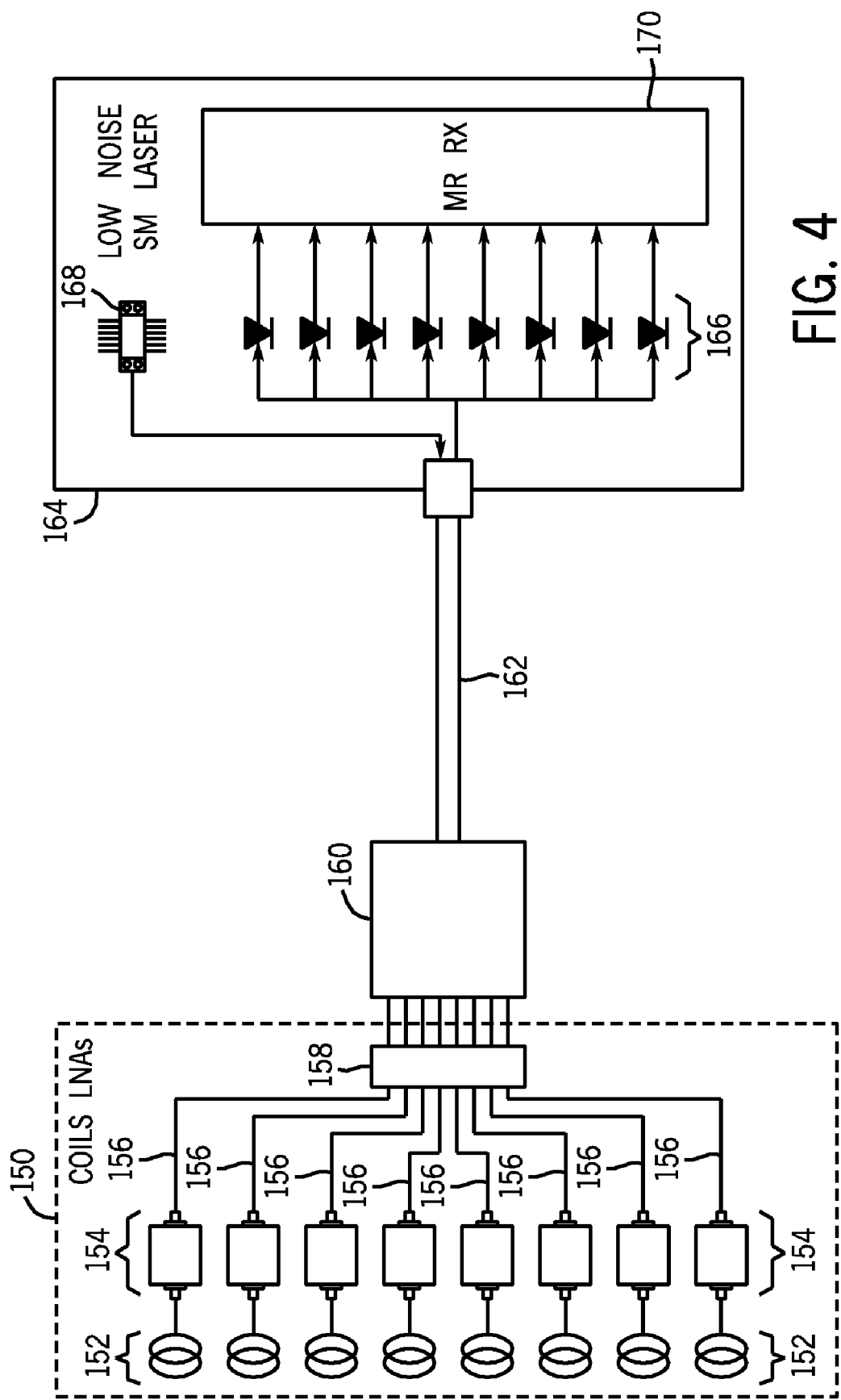
FIG. 4 is a schematic diagram of an MR transmission link using optical modulation in accordance with the present invention.

FIG. 4 shows a more detailed view of the connectivity of an MR system incorporating the present invention and overcoming several drawbacks of lithium-niobate optical modulation. MR scanner 150 includes an eight channel receive coil array 152 connected to a set of low noise amplifiers 154. The output of the amplifiers is electrically connected 156 to an electrical data socket 158 of MR scanner 150. A set of eight silicon-based optical modulators is integrated into an electrical connector housing 160 of optical fiber ribbon 162. It is understood, however, that data from the eight channel array 152 may be multiplexed and transmitted over more or fewer optical modulators and optical fibers. Electrical connector 160 electrically connects to data socket 158. Thus, no optical connection need be made to MR scanner 150. Optical fiber ribbon 162, which may be permanently attached to electrical connector housing 160 as a pigtail connection, transmits a low noise single-mode optical carrier from laser 168 to electrical connector housing 160 for power splitting and internal modulation by the CMOS modulators therein. Eight optical signals are transmitted back across fiber ribbon 162 to a remote data processing station 164 for conversion to electrical signals by photodiode array 166 and for processing by MR data receive unit 170. It is appreciated, however, that the number of optical fibers of optical ribbon 162 may vary to accommodate any number of receive channels of the MR scanner 150 as well as other desired data signals to be transmitted between scanner 150 and processing station 164.

Figure 5:
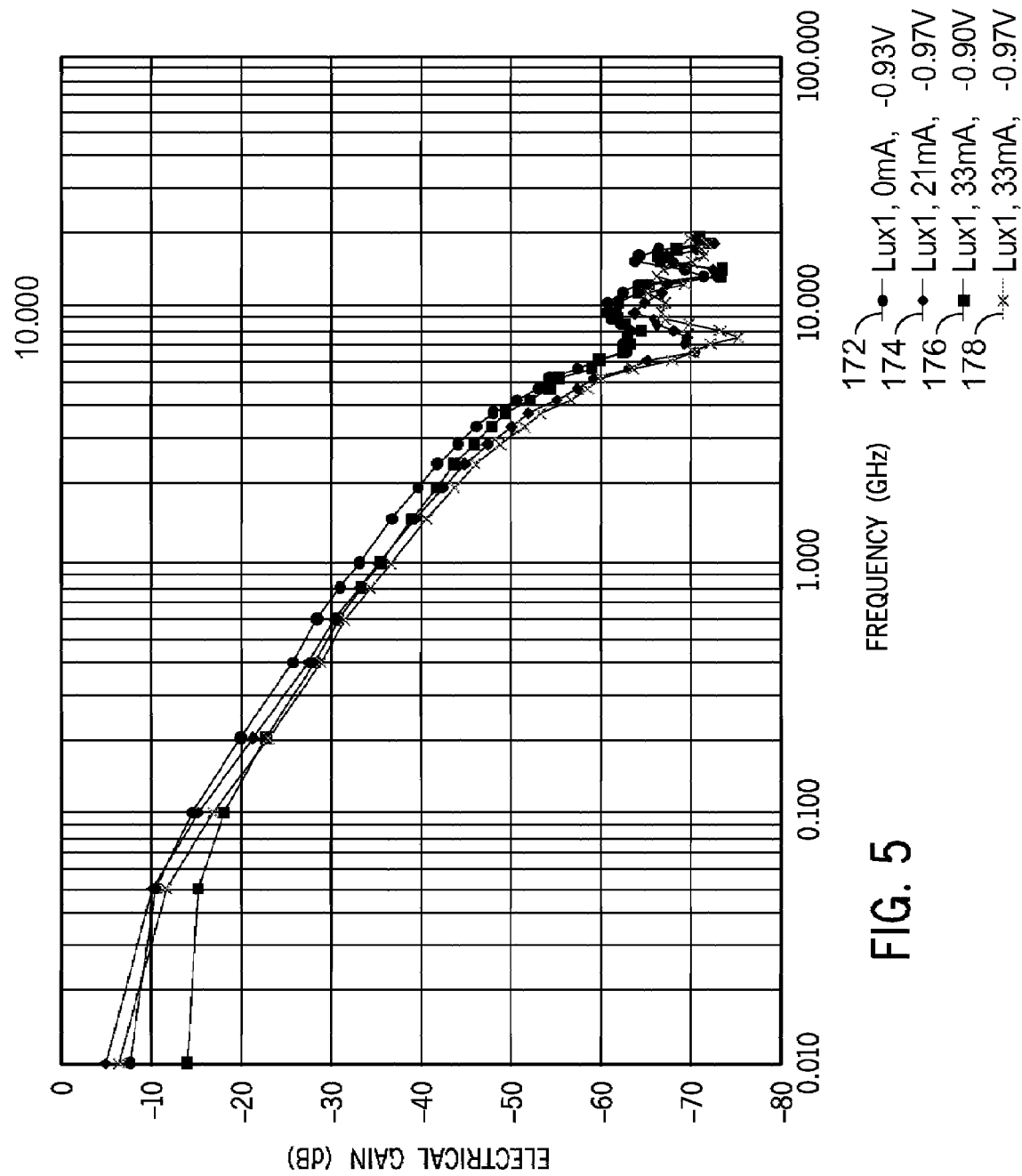
FIG. 5 is an exemplary graph of gain vs. bandwidth for optical data transmission of the present invention.

As discussed above CMOS modulators used in accordance with the present invention may be set to a forward-bias mode of operation. Typically, optical modulators such as the CMOS Photonics™ Platform are used for mass digital data transfer (such as network communication) in which a higher bandwidth is desirable. Thus, the modulators are operated in a reverse-bias mode which can achieve a higher bandwidth (10 GHz and above) at the cost of a higher noise component. However, as known in the art, MR data transfer often occurs at only 64 MHz and is optimized when the noise component is low (about 1 dB). FIG. 5 is a graph of the performance of an exemplary optical modulator operating in a forward-bias mode. Each line 172-178 represents the measured signal gain versus bandwidth for a number of biasing currents and voltages. At 64 MHz all four lines 172-178 exhibit a relatively high signal gain, whereas signal gain drops precipitously as bandwidth approaches 10 GHz. Thus, a forward bias is beneficial for use in transmitting MR signals, but not for transmitting large amounts of data at higher bandwidths.

Accordingly, the present invention is embodied in an MR system which includes a plurality of gradient coils positioned about a bore of a magnet to impress a polarizing magnetic field therein, an RF coil assembly arranged to receive MR signals from a subject of interest, a silicon-based optical modulator, an optical transmission link, and a signal processing unit. The optical modulator receives the signals from the RF coil assembly and modulates an optical signal to encode the signals thereon. The modulated optical signal is transmitted across the optical transmission link to a demodulation unit, which demodulates the signal. The signal processing unit is arranged to receive the demodulated data signal from the demodulation unit and generate an MR image therefrom.

The present invention is further embodied in a method for MR data transmission. The method includes acquiring MR data from an object of interest with at least one RF coil, electrically communicating the MR data to an optical modulator integrated into an electrical connector of the at least one RF coil, and modulating an optical carrier within the electrical connector, based upon the MR data.

In accordance with another embodiment of the invention, an MR data link is disclosed. The data link includes an electrical connector for outputting signals received by RF coils, and has an optical modulator integrated therein. The optical modulator contains an electrical data port for RF coil signals, an optical input for an externally-generated optical beam, a silicon-based modulating circuit to modulate the beam, and an optical output to transmit the modulated beam to an image reconstructor.

The present invention has been described in terms of the preferred embodiment, and it is recognized that equivalents, alternatives, and modifications, aside from those expressly stated, are possible and within the scope of the appending claims.

What is claimed is:

1. An MRI system comprising:
a plurality of gradient coils positioned about a bored of a magnet to impress a polarizing magnetic field;
an RF coil assembly arranged to receive MR signals from a subject of interest;
a silicon-based optical modulator comprising CMOS components connected to receive the signals from the RF coil assembly and configured to modulate an optical signal therewith;
a demodulation unit connected to receive the modulated optical signal and configured to produce a demodulated data signal therefrom;
an optical transmission link connected between the silicon-based modulator and the demodulation unit; and
a signal processing unit arranged to receive the demodulated data signal from the demodulation unit and generate an image therefrom.

2. The MRI system of claim 1 further comprising a circuit configured to apply a biasing voltage to the silicon-based optical modulator to place the silicon-based optical modulator into a forward-biased mode.

3. The MRI system of claim 1 further comprising a connector module attached to the RF coil assembly and having the silicon-based optical modulator integrated therein.

4. The MRI system of claim 1 wherein the RF coil assembly does not have a direct optical connection.

5. The MRI system of claim 1 further comprising an amplification circuit configured to amplify the signals of the RF coil assembly to improve an SNR of the modulated optical signal.

6. The MRI system of claim 1 wherein the RF coil assembly is incorporated into an MR scanner located in a shielded room and the signal processing unit is located outside the shielded room.

7. The MRI system of claim 1 further comprising one silicon-based optical modulator for each of a plurality of RF coils of the RF coil assembly.

8. A method for MR data transmission comprising:
acquiring MR data from an object of interest with at least one RF coil;
electrically communicating the MR data to an optical modulator integrated into an electrical connector of the at least one RF coil; and
modulating an optical carrier within the electrical connector, based upon the MR data; and
wherein modulating the optical carrier includes transporting and modulating the optical carrier within a silicon chip.

9. The method of claim 8 further comprising transmitting the modulated optical carrier to a remotely located data processing station.

10. The method of claim 8 further comprising biasing the optical modulator to a forward bias mode.

11. The method of claim 8 further comprising acquiring MR data with a plurality of RF coils, electrically communicating the MR data of the plurality of RF coils to a plurality of optical modulators, and modulating a plurality of optical carriers with the plurality of optical modulators.

12. The method of claim 8 further comprising conditioning the MR data received by the at least one RF coil to improve an SNR of the modulated optical carrier.

13. An MR data link comprising:
an electrical connector configured to connect to an RF coil of an MR system and receive RF signals therefrom; and
an optical modulator integrated into the electrical connector, the modulator having:
an electrical data port connected to receive the signals from the RF coil;
an optical input arranged to receive an externally-generated optical beam;
a silicon-based modulating circuit designed to modulate the externally-generated optical beam; and
an optical output configured to transmit the modulated optical beam to a remote MR image reconstruction system.

14. The connector of claim 13 wherein the optical modulator is configured to modulate the externally-generated optical beam within a silicon chip.

15. The connector of claim 13 further comprising an amplification circuit designed to increase a gain of the signals received by the RF coils to achieve an SNR sufficient for MR data transmission.

16. The connector of claim 13 wherein the optical modulator does not include a refractive crystal.

17. The connector of claim 13 further comprising a biasing circuit electrically connected to maintain the optical modulator in a forward bias mode.

18. The connector of claim 13 wherein the optical output connection comprises an optical fiber ribbon connected at a first end to the electrical connector and connected at a second end to the remote MR image reconstruction system.

* * * * *